United States Patent [19]

Nagano

[11] Patent Number: 4,754,166
[45] Date of Patent: Jun. 28, 1988

[54] RESET CIRCUIT FOR INTEGRATED INJECTION LOGIC

[75] Inventor: Katsumi Nagano, Shimonoseki, Japan

[73] Assignee: Tokyo Shibaura Denki Kabushiki Kaisha, Shimonoseki, Japan

[21] Appl. No.: 937,429

[22] Filed: Dec. 3, 1986

Related U.S. Application Data

[63] Continuation of Ser. No. 485,218, Apr. 15, 1983, abandoned.

[30] Foreign Application Priority Data

Apr. 21, 1982 [JP] Japan .................................. 57-66609
May 31, 1982 [JP] Japan .................................. 57-92891

[51] Int. Cl.$^4$ .......................... H03K 3/01; H03K 5/13
[52] U.S. Cl. .................................. 307/296 R; 307/477; 307/592; 307/597
[58] Field of Search ............... 307/477, 289, 290, 592, 307/597, 296 R, 297, 200 A, 454, 475, 596

[56] References Cited

U.S. PATENT DOCUMENTS

| | | | |
|---|---|---|---|
| 3,122,697 | 2/1964 | Kauders | 361/92 |
| 3,191,073 | 6/1965 | Mooney | 307/290 |
| 3,560,767 | 2/1971 | Traub | 307/597 |
| 3,725,675 | 4/1973 | Olsen | 307/200 A |
| 3,764,818 | 10/1973 | Masuda et al. | 307/297 |
| 3,813,565 | 5/1974 | Guilleux | 307/308 |
| 3,938,316 | 2/1976 | Morokawa et al. | 307/360 |
| 4,013,901 | 3/1977 | Payne | 307/268 |
| 4,159,431 | 6/1979 | Roozenbeek et al. | 307/296 R |
| 4,232,236 | 11/1980 | Yomogida et al. | 307/290 |
| 4,254,347 | 3/1981 | Ray | 307/297 |
| 4,570,089 | 2/1986 | Nagano | 328/15 |

FOREIGN PATENT DOCUMENTS

| | | | |
|---|---|---|---|
| 2613937 | 10/1977 | Fed. Rep. of Germany | 307/297 |
| 3019235 | 11/1980 | Fed. Rep. of Germany | |
| 1195546 | 11/1967 | United Kingdom | 307/297 |

OTHER PUBLICATIONS

Williams, "Low Voltage Level-Sensing Circuit"; Electronic Engineering; vol. 40, No. 487, pp. 517-519, 9/68.
Turner, "Circuit for Detecting Missing Power Supply Voltage"; IBM Tech. Disclosure Bulletin; vol. 21, No. 3, 8/78.
Japanese Patent Disclosure (KOKAI) No. 55-156420 I. Suzuki (Dec. 5, 1980).

*Primary Examiner*—Stanley D. Miller
*Assistant Examiner*—Timothy P. Callahan
*Attorney, Agent, or Firm*—Finnegan, Henderson, Farabow, Garrett & Dunner

[57] ABSTRACT

A transistor circuit has a first series circuit of first and second resistors coupled between a power source line and a circuit ground line. A second series circuit of third and fourth resistors is connected in parallel to the first series circuit. A first transistor is coupled at its collector-emitter path between the junction of third and fourth resistors and the circuit ground line. The first transistor is on-off controlled by a potential appearing at the junction of the first and second resistors. A second transistor is coupled at its collector-emitter path between an output terminal of the transistor circuit and the circuit ground line. The second transistor is on-off controlled by a potential appearing at the junction of the third and fourth resistors. The ratio of the resistance value of the first resistor to that of the second resistor is larger than the ratio of the resistance value of the third resistor to that of the fourth resistor.

10 Claims, 8 Drawing Sheets

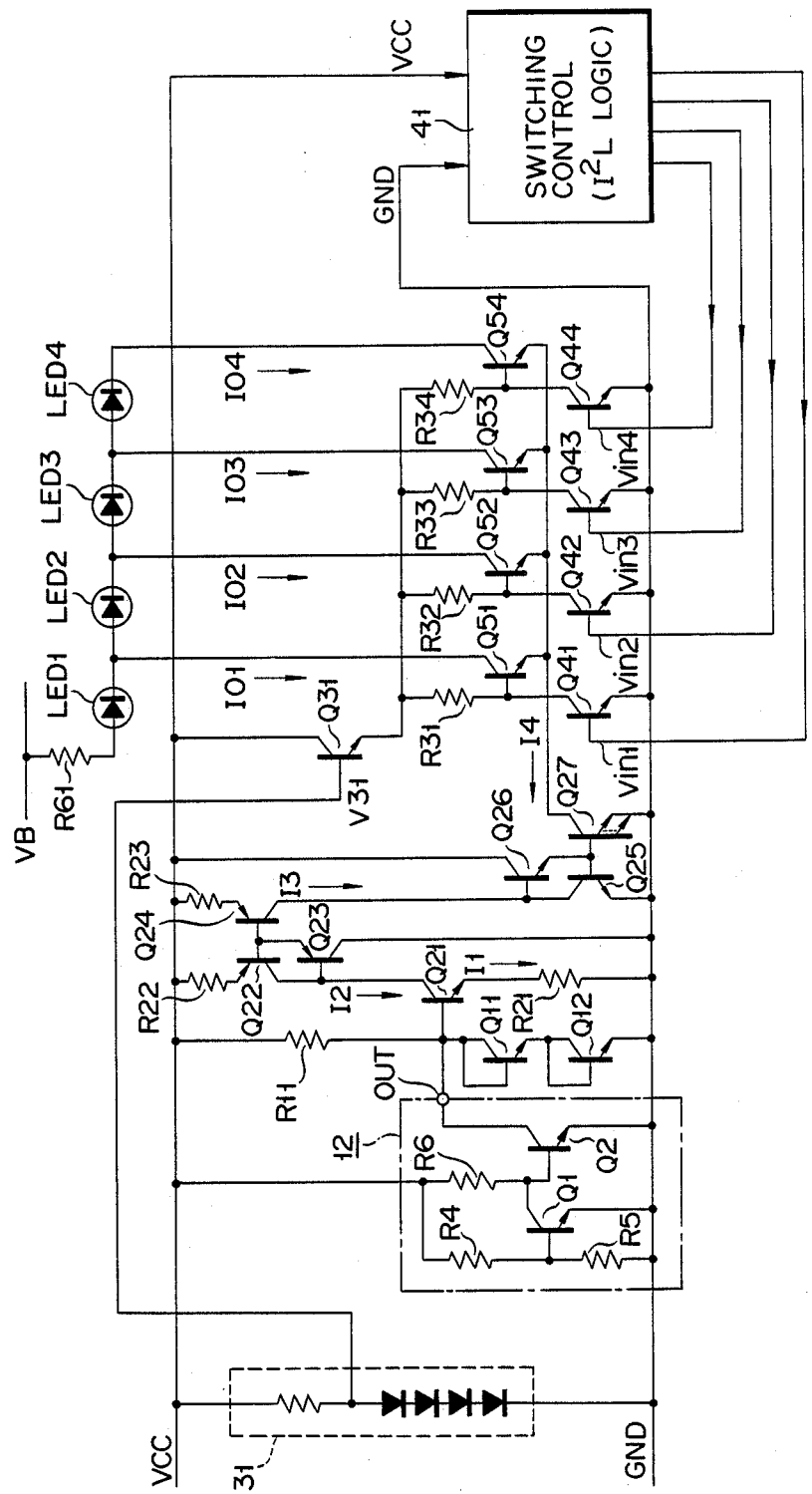
F I G. 5

F I G. 11
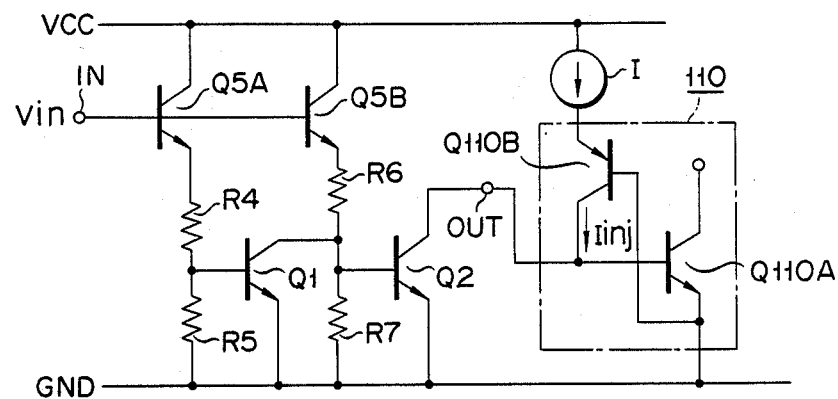
F I G. 12
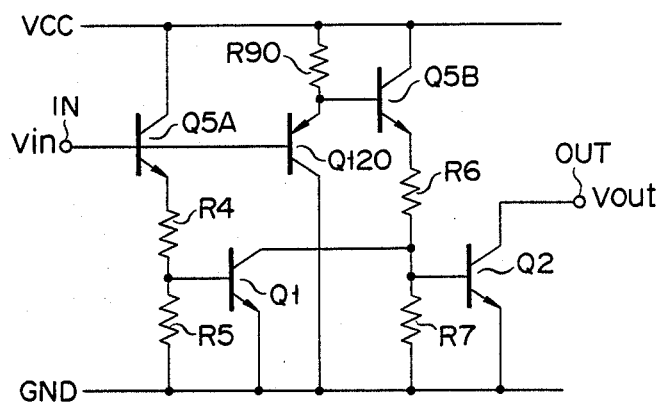

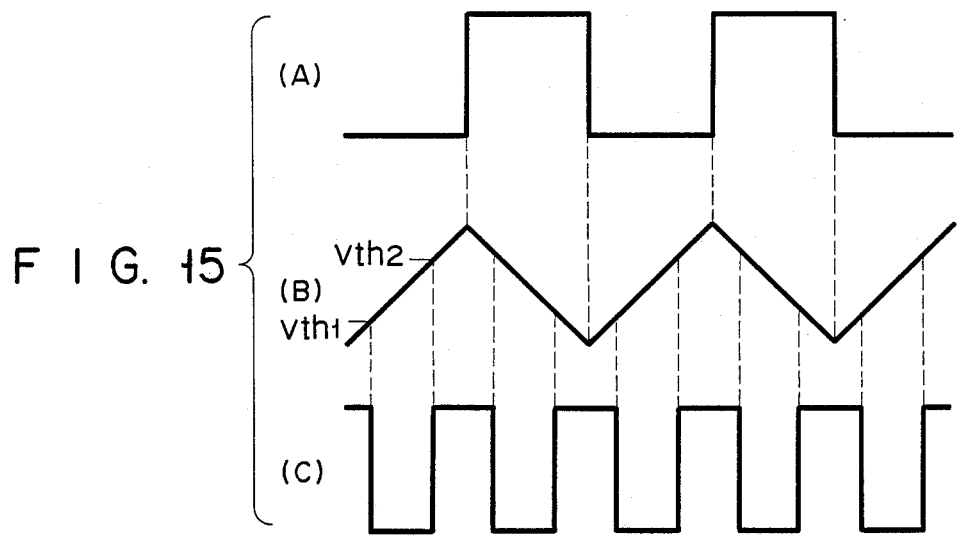
F I G. 15
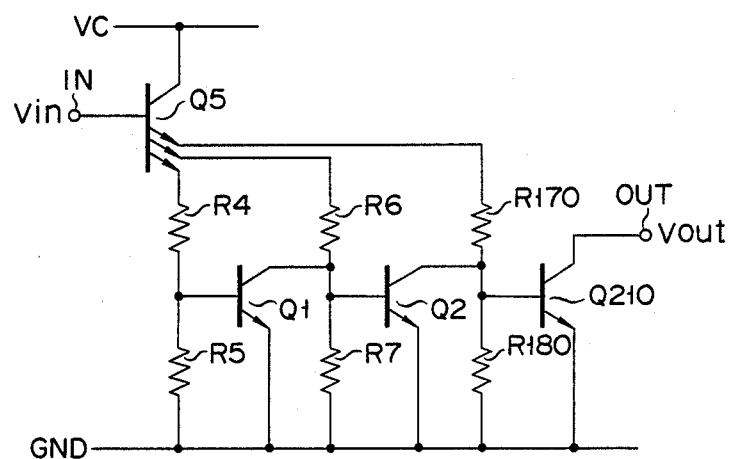
F I G. 16

RESET CIRCUIT FOR INTEGRATED INJECTION LOGIC

This application is a continuation of application Ser. No. 485,218, filed Apr. 15, 1983.

BACKGROUND OF THE INVENTION

The present invention relates to a transistor circuit which is applicable to a circuit for resetting an I²L (Integrated Injection Logic) circuit containing linear and digital circuits at a low power source potential.

A conventional reset circuit for initializing a semiconductor integrated circuit at the time when a power switch is turned on, for example, has a circuit configuration as shown in FIG. 1. In this figure a series circuit of resistors R1 and R2 is coupled between a power source Vcc line and a circuit ground line. A potential VA appearing at the junction A of resistors R1 and R2 is applied as a reference potential to one input of a comparator circuit 11. The other input of comparator 11 receives a comparison potential VB which appears at the junction B of a series circuit of a resistor R3 and a capacitor C. The series circuit of resistor R3 and capacitor C is coupled between the power source Vcc line and the circuit ground line. The potential rising speed of potential VA at the junction A is faster than that of potential VB at the junction B. Comparator 11 detects the potentials at the junctions A and B and generates a reset signal RS according to the difference between the rising speed of potential VA and that of potential VB.

A circuit having the abovementioned configuration will operate as follows. As shown in FIG. 2, when a power switch (not shown) is turned on at the time t1, the potential VA of junction A rapidly rises from the ground potential "0" to a prescribed potential "Vcc", while the potential VB of junction B rises slowly. The rising speed of potential VB depends on the time constant C·R3. When the potential VB exceeds the threshold level or the reference potential VA (e.g., ½ Vcc) of comparator 11 at the time t2, the level of output RS of comparator 11 is changed from "0" to "1". In the circuit of FIG. 1, "0" level of output RS is used as the reset signal.

According to the prior art reset circuit as mentioned above, no measures have been taken for operating with a relatively low power source potential (less than about 5 V). Thus, it is practically impossible to adapt the prior art reset circuit to an I²L (Integrated Injection Logic) circuit which can operate with a low potential of about 0.7 volts or more. A new reset circuit which can operate with said low power source potential is now in demand.

SUMMARY OF THE INVENTION

It is accordingly the object of this invention to provide a transistor circuit which is applicable to a reset circuit being operable with a low voltage and applicable to an I²L circuit containing linear and logic circuits, and which is also applicable to a window comparator.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the transistor circuit of the present invention has a first series circuit of first and second resistors coupled between an input terminal and a circuit ground line. A second series circuit of third and fourth resistors is coupled between the input terminal and the circuit ground line. A first transistor is coupled at its collector-emitter path between the junction of third and fourth resistors and the circuit ground line. The first transistor is on-off controlled by a potential appearing at the junction of the first and second resistors. A second transistor is coupled at its collector-emitter path between an output terminal of the transistor circuit and the circuit ground line. The second transistor is on-off controlled by a potential appearing at the junction of the third and fourth resistors.

The ratio (R4/R5) of the resistance value of the first resistor (R4) to that of the second resistor (R5) is larger than the ratio (R6/R7) of the resistance value of the third resistor (R6) to that of the fourth resistor (R7). As long as the above condition (R4/R5>R6/R7) is satisfied, the resistance of third resistor (R6) may be zero, or the resistance of fourth resistor (R7) may be infinite. Thus, when the third resistor (R6) is short-circuited, this is equivalent to the third resistor (R6) being 0 ohms and, when the fourth resistor (R7) is omitted, this is equivalent to the fourth resistor being ∞ ohms. Although 0 ohms of the third resistor is not switchable for a reset circuit, such a case may be practicable when the power source line of the transistor circuit is coupled via any resistive element to the power source line of any associated circuit. In this case this resistive element prevents the power source line of the associated circuit from short-circuiting when the first transistor is turned on. Infinite ohms of the fourth resistor may be used whether or not the power source line of the transistor circuit is common with that of the associated circuit or an I²L circuit, unless the third resistor is 0 ohms.

The accompanying drawings, which are incorporated in and constitute a part of this specification, illustrate embodiments of the invention and, together with the description, serve to explain the principles of the invention.

BRIEF DESCRIPTION OF THE DRAWINGS

FIG. 5 shows an LED driver circuit utilizing a transistor circuit constructed in accordance with the present invention;

FIG. 11 shows a case where the embodiment of FIG. 8 is applied to an input interface circuit of an I²L circuit;

FIGS. 12 to 14 show modifications of FIG. 8;

FIG. 15 shows timing charts illustrating the operation of a frequency multiplier which is one application of the circuit configuration of the embodiment shown in FIG. 8; and FIGS. 16 to 18 show further modifications of FIG. 8.

DETAILED DESCRIPTION OF THE PREFERRED EMBODIMENTS

Before proceeding with the description of the embodiments of the invention, it is to be expressly understood that like reference symbols are used to designate like elements throughout the drawings for simplicity of illustration and that the components designated by like reference symbols may easily be exchanged with each other or one another with minor change thereof by a person skilled in the art.

Figure 1:
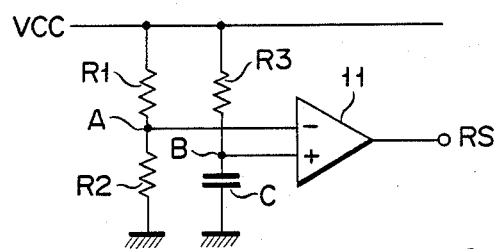
FIG. 1 shows a prior art reset circuit.
Figure 2:
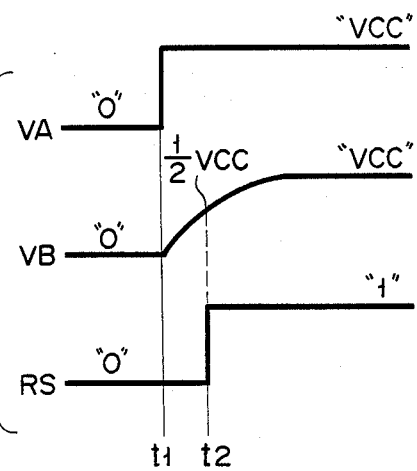
FIG. 2 shows timing charts illustrating the operation of the circuit of FIG. 1.
Figure 3:
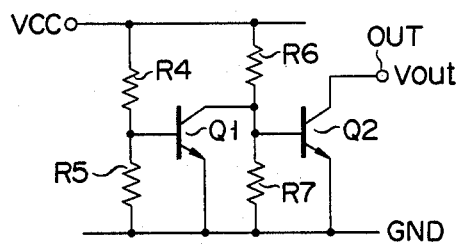
FIG. 3 shows a transistor circuit adapted to a reset circuit and constructed according to the present invention.

FIG. 3 shows a transistor circuit of the invention being adapted to a reset circuit. In FIG. 3 a first resistor R4 is connected in series to a second resistor R5, and a third resistor R6 is connected in series to a fourth resistor R7. The series circuit of resistors R4 and R5 is coupled between a positive power source Vcc line of a first terminal and a circuit ground GND line of a second terminal. The series circuit of resistors R6 and R7 is connected in parallel to the series circuit of resistors R4 and R5. The junction of resistors R6 and R7 is coupled to the circuit ground line via the collector-emitter path of a first transistor Q1 of an NPN type. The base of transistor Q1 is connected to the junction of resistors R4 and R5. An output terminal OUT of the reset circuit is coupled to the circuit ground line via the collector-emitter path of a second transistor Q2 of the NPN type. The base of transistor Q2 is connected to the junction of resistor R6 and R7.

The reset circuit of FIG. 3 will operate as follows. Suppose the resistance of each of the resistors R4 to R7 is so selected that the relationship below be satisfied.

$$R4/R5 > R6/R7 \quad (1)$$

Further suppose that V1 is a first power source potential on the Vcc line, V2 is a second power source potential on the Vcc line, and $V_{BE}$ is a base-emitter voltage of each of the transistors Q1 and Q2. Then, the following equations are given.

$$V1 = (R6/R7 + 1)V_{BE} \quad (2)$$

$$V2 = (R4/R5 + 1)V_{BE} \quad (3)$$

From equations (1) to (3), it can be seen that the relation "V1<V2" holds.

Figure 4:
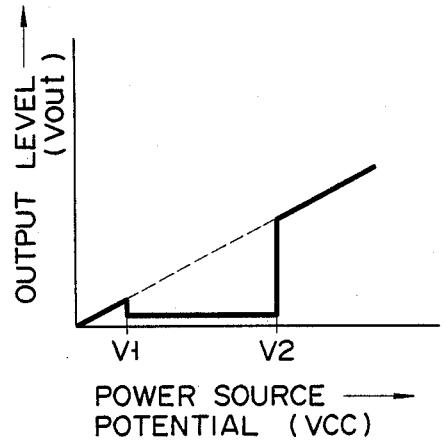
FIG. 4 is a graph showing the relation of the power source potential vs. the output level of the transistor circuit of FIG. 3.

FIG. 4 shows the relations among the potentials V1, V2, Vcc and Vout. When Vcc<V1, both of the transistors Q1 and Q2 are in the OFF state, and an output terminal OUT is in an open-collector state. When V1<Vcc<V2, the transistors Q1 and Q2 are OFF and ON, respectively, and the logical level of output signal Vout becomes "L". When V2<Vcc, the transistors Q1 and Q2 are ON and OFF, respectively, and the output signal Vout becomes "H". Thus, the logical level of output signal Vout is changed at the two threshold potentials V1 and V2. Namely, these potentials V1 and V2 define specific inversion potentials of the Vcc line.

The transistor Q2 is turned on and provides a reset signal corresponding to the output signal Vout having "L" level only when the potential of Vcc line falls between the two potentials V1 and V2. For instance, when specific resistance values are assigned such that R4=60k ohms, R5=20k ohms, R6=30k ohms, R7=infinite ohms, and the base-emitter voltage $V_{BE}$ of each of the transistors Q1 and Q2 is 0.7 volts, then the specific inversion potentials V1 and V2 are 0.7 volts and 2.8 volts, respectively, as is evident from equations (2) and (3). Thus, the transistor Q2 is turned on to provide the reset signal (corresponding to Vout having logical "L" level) when 0.7 V<Vcc<2.8 V. This means that the reset circuit of the invention enables an I²L circuit which consists of a linear (analog) circuit and a logic (digital) circuit to be reset and to be operable with a low power source potential (e.g., less than 3 volts).

FIG. 5 shows a driver circuit for energizing a bar-graphed LED array, which is one example of an application of the reset circuit according to the present invention. In FIG. 5 the circuit block 12 contains a reset circuit having a configuration similar to that of FIG. 3 (but R7 is infinite in FIG. 5). The collector of NPN transistor Q2 is coupled via a resistor R11 to a power source Vcc line, and also coupled via a series circuit of diode-connected NPN transistors Q11 and Q12 to a circuit ground GND line. The elements R11, Q11 and Q12 constitute a constant voltage source (or voltage divider) whose output voltage is on-off controlled by the transistor Q2.

The junction between resistor R11 and transistor Q11 is connected to the base of an NPN transistor Q21. The emitter of transistor Q21 is coupled via a resistor R21 to GND line and the collector thereof is connected to the collector of a PNP transistor Q22. The collector and base of transistor Q22 are connected to the base and emitter of a PNP transistor Q23, respectively. The collector of transistor Q23 is connected to GND line. The base of transistor Q22 is connected to the base of a PNP transistor Q24. The emitters of transistors Q22 and Q24 are coupled respectively via resistors R22 and R23 to Vcc line. The collector of transistor Q24 is coupled via the collector-emitter path of an NPN transistor Q25 to GND line. The base of transistor Q25 is connected to the emitter of an NPN transistor Q26 and to the base of an NPN multi-emitter transistor Q27. The base and collector of transistor Q26 is connected to the collector of transistor Q25 and Vcc line, respectively. The emitter of transistor Q27 is connected to GND line.

The elements R21 to R23 and Q21 to Q27 constitute a constant current source.

The collector of transistor Q27 is connected to each emitter of NPN transistors Q51 to Q54. The bases of transistors Q51 to Q54 are coupled respectively via resistors R31 to R34 to the emitter of an NPN transistor Q31. The collector of transistor Q31 is connected to Vcc line. The base of transistor Q31 receives a bias potential V31. Potential V31 is obtained from a constant voltage source 31 being formed of a series connected resistor and stacked diodes which are forwardly biased. The bases of transistors R51 to Q54 are coupled respectively via the collector-emitter paths of NPN transistors Q41 to Q44 to GND line. The bases of transistors Q41 to Q44 receive drive signals Vin1 to Vin4, respectively. These signals Vin1 to Vin4 are obtained from a digital circuit 41 which is formed of, e.g., an I²L circuit.

The collector of transistor Q51 is connected to the cathode of a first light-emitting diode LED1 and to the anode of a second light-emitting diode LED2. The anode of LED1 is coupled via a resistor R61 to an LED power source VB line which is independent of the Vcc line and whose line potential is +16 volts, for example. The collector of transistor Q52 is connected to the cathode of LED2 and to the anode of a third light-emitting diode LED 3. The collector of transistor Q53 is connected to the cathode of LED3 and to the anode of a fourth light-emitting diode LED4. The collector of transistor Q54 is connected to the cathode of LED4.

The elements Q41 to Q44 and Q51 to Q54 constitute a switching circuit for selectively energizing LED1 to LED4 according to the logical state of the drive signals Vin1 to Vin4. The elements 31, R31 to R34 and Q31 constitute a bias circuit for biasing the switching circuit.

The circuit configuration of FIG. 5 will operate as follows.

Suppose that the potential of Vcc line is +5 volts, the base-emitter voltage $V_{BE}$ of all of illustrated transistors is 0.7 volts, and the bias voltage V31 is 2.8 volts.

In a stationary state (Vcc=5 V), the transistors Q1 and Q2 are ON and OFF, respectively, and the level of the reset signal outputted from the collector of transistor Q2 is "H". In this case the base potential of transistor Q21 is 1.4 volts (=2 $V_{BE}$) and the emitter potential thereof is 0.7 volts. When R21=470 ohms, the emitter current I1 of transistor Q21 is about 1.5 mA. If the common-emitter current gain $h_{FE}$ of transistor Q21 is large enough ($h_{FE} >> 1$), the collector current I2 is also about 1.5 mA. This I2=1.5 mA is inputted to a first current mirror circuit formed of the elements R22, R23 and Q22 to Q24. When the current transfer rate of the first current mirror circuit is "1", an output current I3 of this current mirror is about 1.5 mA. The output current I3 is inputted to a second current mirror current formed of the elements Q25 to Q27. When the ratio of emitter areas of transistors Q25 and Q27 is 1:10 (transfer rate is 10), an output current I4 of the second current mirror circuit is about 15 mA.

changed according to the logical level combination of the drive signals Vin1 to Vin4.

In the circuit of FIG. 5 the transistor Q31 may be sufficiently biased with V31 even where the potential of Vcc line is less than 5 volts. More concretely, the switching circuit (Q41 to Q54) can energize any of LED1 to LED4 when 1.4 V<Vcc<3 V, for example. However, generally speaking, the digital circuit 41 designed for operating under Vcc=5 V cannot accurately operate below the limit power source potential, e.g., Vcc=3 V. Thus, during the time immediately after the power-on and the potential of Vcc line does not sufficiently exceed 3 volts, erroneous signals Vin1 to Vin4 could be applied to the transistors Q41 to Q44 with a sufficient base bias V31 (which may be less than the rated value 2.8 V). Then, any of LED1 to LED4 could be erroneously lighted at the initial stage of the power-on unless the reset circuit 12 operates.

The reset circuit 12 prevents the above erroneous operation. When 0.7 V<Vcc<2.8 V, the transistors Q1 and Q2 are OFF and ON, respectively. In this case the base potential of transistor Q21 is rendered nearly zero, resulting in I1=I2=I3=I4=0. Accordingly, none of the LEDs are erroneously lighted.

Figure 6:
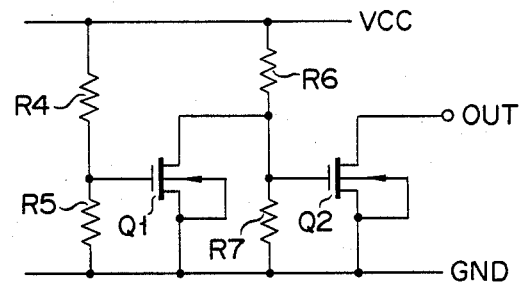
FIG. 6 shows a modification of the transistor circuit of FIG. 3.

FIG. 6 shows a modification of FIG. 3. In FIG. 6, an enhancement type Nch MOS transistor is used for each of the transistors Q1 and Q2. Where the gate-source threshold voltages of MOS transistors Q1 and Q2 are Vth1 and Vth2, respectively, the inversion potentials V1 and V2 are:

$$V1 = (R6/R7 + 1)Vth2 \quad (2A)$$

$$V2 = (R4/R5 + 1)Vth1 \quad (3A)$$

If Vth1=Vth2, the aforesaid equation (1) should hold. If Vth1≠Vth2, the following relationship should be satisfied.

TABLE 1

| INPUT | | | | OUTPUT | | | | | | | |
|---|---|---|---|---|---|---|---|---|---|---|---|
| Vin1 | Vin2 | Vin3 | Vin4 | Q51 | Q52 | Q53 | Q54 | LED1 | LED2 | LED3 | LED4 |
| L | H | H | H | ON | OFF | OFF | OFF | ON | OFF | OFF | OFF |
| H | L | H | H | OFF | ON | OFF | OFF | ON | ON | OFF | OFF |
| H | H | L | H | OFF | OFF | ON | OFF | ON | ON | ON | OFF |
| H | H | H | L | OFF | OFF | OFF | ON | ON | ON | ON | ON |

Table I shows a truth table explaining the operation of the circuit of FIG. 5. When the levels of drive signals Vin1, Vin2, Vin3 and Vin4 are L, H, H and H, respectively, only the transistor Q51 is turned on and a drive current I01 corresponding to the output current I4 of the second current mirror circuit flows through transistor Q51 into LED1. Then, only LED1 is lighted. When Vin1 to Vin4 are H, L, H and H, only the transistor Q52 is turned on so that a drive current I02 corresponding to the current I4 flows through transistor Q52 into LED1 and LED2. Then, LED1 and LED2 are lighted. When Vin1 to Vin4 are H, H, L and H, only the transistor Q53 is turned on so that a drive current I03 corresponding to the current I4 flows through transistor Q53 into LED1 to LED3, and LED1 to LED3 are lighted. When Vin1 to Vin4 are H, H, H and L, only the transistor Q54 is turned on so that a drive current I04 corresponding to the current I4 flows through transistor Q54 into LED1 to LED4 and all LEDs are lighted. The length of the lighted LEDs i.e., the bar length of the LED array, is $$(R4/R5 + 1)Vth1 > (R6/R7 + 1)Vth2 \quad (1A)$$

So long as the equation (1A) is satisfied, the resistance value of resistor R7 may be infinite, i.e., the resistor R7 may be omitted.

Figure 7:
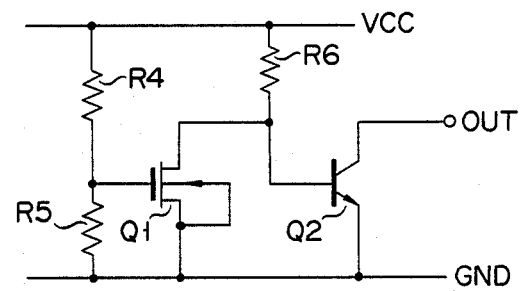
FIG. 7 shows another modification of the transistor circuit of FIG. 3.

FIG. 7 shows another modifications of FIG. 3. Thus, FIG. 7 shows a hybrid circuit of an Nch MOS transistor Q1 and an NPN bipolar transistor Q2.

Figure 8:
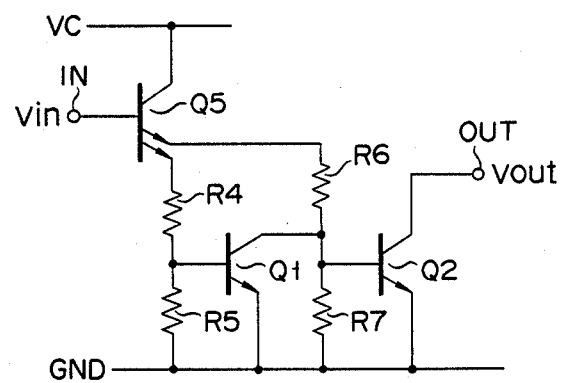
FIG. 8 shows a transistor circuit adapted to a window comparator and constructed according to the present invention.

FIG. 8 shows another transistor circuit of the invention which is adapted to a window comparator. An input terminal (first terminal) IN is connected to the base of an NPN multi-emitter transistor Q5. Terminal IN is used for receiving an input signal Vin of the window comparator. The collector of transistor Q5 is supplied with a positive power supply potential Vcc. A first emitter of transistor Q5 is coupled to a terminal (second terminal) of a GND line via a series circuit of resistors R4 and R5. A second emitter of transistor Q5 is coupled to the GND line via a series circuit of resistors R6 and R7. The junction of resistors R4 and R5 is connected to the base of an NPN transistor Q1. The collector and emitter of transistor Q1 are connected in parallel to resistor R7. Connected also in parallel to the resistor R7 are the base and emitter of an NPN transistor Q2. The collector of transistor Q2 is connected to an output terminal OUT.

When the aforementioned equation (1) holds and Vcc of FIG. 3 is exchanged with Vin of FIG. 8, the circuit operation of FIG. 8 is substantially the same as that of FIG. 3. Suppose that VthL is a first inversion potential of signal Vin, VthH is a second inversion potential of signal Vin, and $V_{BE}$ is a base-emitter voltage of each of transistors Q1, Q2 and Q5. Then, the following equations are established:

$$VthL = (R6/R7 + 2)V_{BE} \quad (2B)$$

$$VthH = (R4/R5 + 2)V_{BE} \quad (3B)$$

Figure 9:
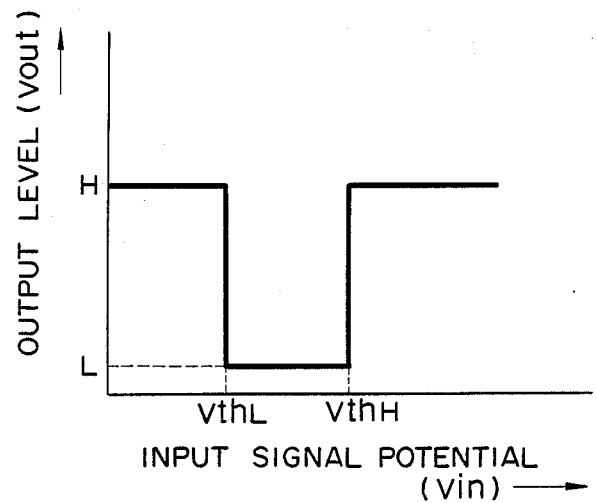
FIG. 9 is graph showing the relation of the input signal potential vs. the output level of the transistor circuit of FIG. 8.

FIG. 9 shows the relationships among the potentials VthL, VthH, Vin and Vout. When Vin<VthL, the base potential VB2 of transistor Q2 may be represented as:

$$VB2 = (Vin - V_{BE})/(R6/R7 + 1) \quad (4)$$

From the relationship "Vin<VthL" and equation (2B), equation (4) may be modified as:

$$Vin = (R6/R7 + 1) VB2 + V_{BE} < (R6/R7 + 2) V_{BE} \quad (5)$$

$$\therefore (R6/R7 + 1) VB2 < (R6/R7 + 1) V_{BE}$$

$$\therefore VB2 < V_{BE}$$

Equation (5) indicates that, when the potential of input signal Vin is lower than the first inversion potential VthL, since $VB2 < V_{BE}$, the transistor Q2 is rendered OFF and the output signal Vout becomes "H" level, as shown in FIG. 9 (Vin<VthL).

When Vin>VthL, the base potential VB2 of transistor Q2 exceeds the base-emitter voltage $V_{BE}$ thereof, and transistor Q2 is rendered ON. Then, the output signal Vout becomes "L" level (FIG. 9; VthL<Vin<VthH).

When Vin>VthH, the base potential VB1 of transistor Q1 may be represented as:

$$VB1 = (Vin - V_{BE})/(R4/R5 + 1) \quad (6)$$

From the relationship "Vin>VthH" and equation (3B), equation (6) may be modified as:

$$Vin = (R4/R5 + 1) VB1 + V_{BE} > (R4/R5 + 2) V_{BE} \quad (7)$$

$$\therefore (R4/R5 + 1) VB1 > (R4/R5 + 1) V_{BE}$$

$$\therefore VB1 > V_{BE}$$

Equation (7) indicates that, when the potential of input signal Vin is higher than the second inversion potential VthH, since $VB1 > V_{BE}$, the transistor Q1 is rendered ON. Then, the base-emitter path of transistor Q2 is short-circuited via the collector-emitter path of turned-on transistor Q1, resulting in transistor Q2 being turned OFF and Vout="H" (FIG. 9; Vin>VthH).

As shown in FIG. 9, the transistor circuit of FIG. 8 provides an output signal Vout with logical "L" level only when the potential of input signal Vin falls within the range between the inversion potential VthL and the inversion potential VthH. Thus, the circuit of FIG. 8 functions as a window comparator.

Figure 10:
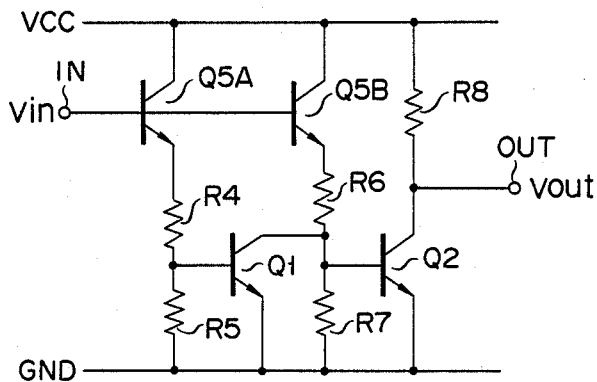
FIG. 10 shows a trial circuit of FIG. 8.

FIG. 10 shows a trial circuit of FIG. 8. In the configuration of FIG. 10, two parallel transistors Q5A and Q5B are used for the dual emitter transistor Q5 of FIG. 8, and a load resistor R8 is coupled between a Vcc line and the collector of transistor Q2. In this configuration, suppose that R4=22 kΩ, R5=R6=R7=R8=5.6 kΩ. Then, from equations (2B) and (3B), the inversion potentials VthL and VthH are VthL≈2.1 V
VthH≈4.2 V Where Vcc=6 V and signal Vin is a triangular wave of 1 kHz, then the actual data of the experiments are VthL=2.2 V VthH=4.2 V These experimental data would support the adequateness of the description referring to FIG. 8. Incidentally, the circuit of FIG. 10 operated normally for a 100 kHz input.

FIG. 11 shows another transistor circuit of the invention which is used for an input interface circuit of an I²L circuit. In FIG. 11 the output terminal OUT is connected to the gate of an I²L circuit 110. The gate of circuit 110 is connected to the base of an NPN transistor Q110A. The base of transistor Q110A receives an injector current Iinj from the collector of a PNP transistor Q110B. The base of transistor Q110B and the emitter of transistor Q110A are connected to the GND line, and the emitter of transistor Q110B is connected to a current source I. The collector of transistor Q110A provides an inverted output of said output signal Vout. In the configuration of FIG. 11, the load resistor R8 of FIG. 10 is omitted because the injection current Iinj is supplied.

FIG. 12 shows an improvement of FIG. 10. In the configuration of FIG. 12, the base potential of transistor Q5B is level-shifted by a PNP transistor Q120 and a resistor R90 in order to decrease the first inversion potential VthL. According to the configuration of FIG. 8 or 10, the lower limit of VthL will be about 1.4 volts (=2 $V_{BE}$), while the lower limit of VthL of FIG. 12 will be about 0.7 volts (=$V_{BE}$).

Figure 13:
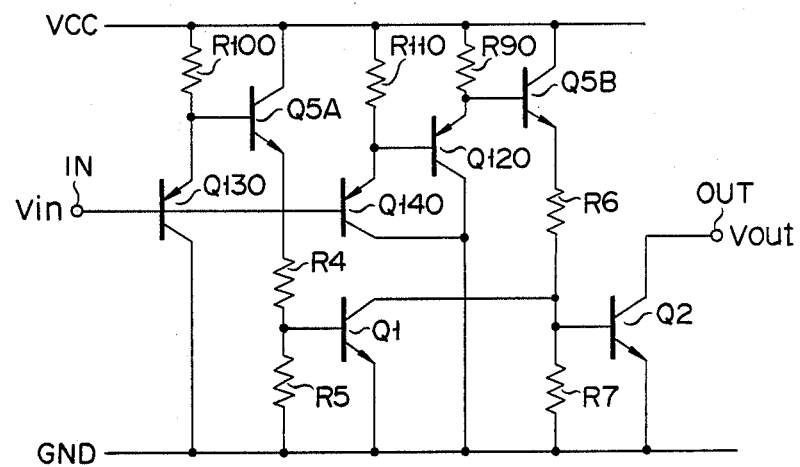

FIG. 13 shows a further improvement of FIG. 10. In the configuration of FIG. 13 the base potential of transistor Q5B is level-shifted by a two-stage Darlington-connected PNP transistors Q120 and Q140 and resistors R90 and R110. The lower limit of first inversion potential VthL of FIG. 13 can be reduced to about 0 volts and the lower limit of second inversion potential VthH can be set at about 0.7 volts. Thus, the freedom of circuit design as to the inversion levels is increased.

Figure 14:
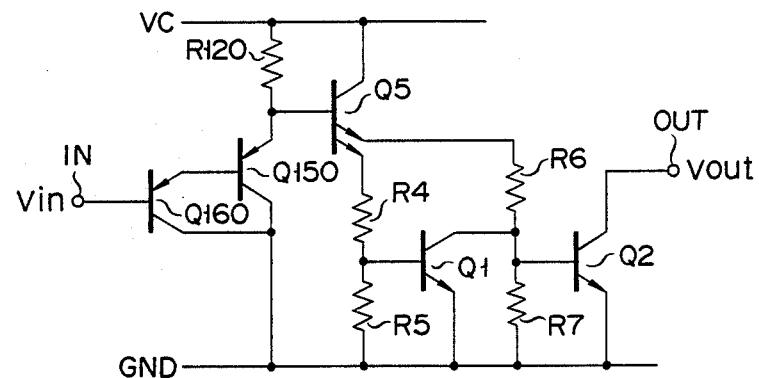

FIG. 14 shows a modification of FIG. 8. In FIG. 14, a two-stage Darlington-connected PNP transistors Q150 and Q160 and a resistor R120 are provided at the input circuit of FIG. 8. Transistors Q150 and Q160 shift the first and second inversion potentials VthL and VthH by about 2 $V_{BE}$. Then, VthL≈0 volts is possible.

A window comparator as shown in any one of FIGS. 8 and 10 to 14 has various applications. For instance, such a window comparator may be used as a duty cycle detector. When a pulse having a 50% duty cycle and an amplitude of Vcc is averaged, the averaged potential becomes 0.5 Vcc. When the duty falls below 40%, the averaged potential becomes less than 0.4 Vcc. When the duty exceeds 60%, the averaged potential becomes more than 0.6 Vcc. Accordingly, when the inversion potentials VthL and VthH are set to 0.4 Vcc and 0.6 Vcc, respectively, the window comparator detects an erroneous input signal whose duty cycle deviates from the rated range of 40% to 60%.

A window comparator type input interface circuit of the invention may be used for a frequency multiplier. FIG. 15 illustrates the operation of the frequency multiplier. An input signal A is integrated by an integrator (not shown) and converted into a triangular signal B. The window comparator detects the potential of signal B at the inversion potentials VthL and VthH and outputs a frequency-multiplied (doubled) signal C. The duty cycle of the signal can be freely changed according to the value of potentials VthL and VthH.

FIG. 16 shows a modification of FIG. 8. In FIG. 16, when the following relationship holds, the circuit of FIG. 16 may have three inversion potentials.

$$R4/R5 > R6/R7 > R170/R180 \quad (8)$$

When a triangular input signal Vin as shown in FIG. 15B is applied to the base of a triple-emitter transistor Q5, a frequency-multiplied output signal Vout whose frequency corresponds to the triple of input signal Vin can be obtained.

Figure 17:
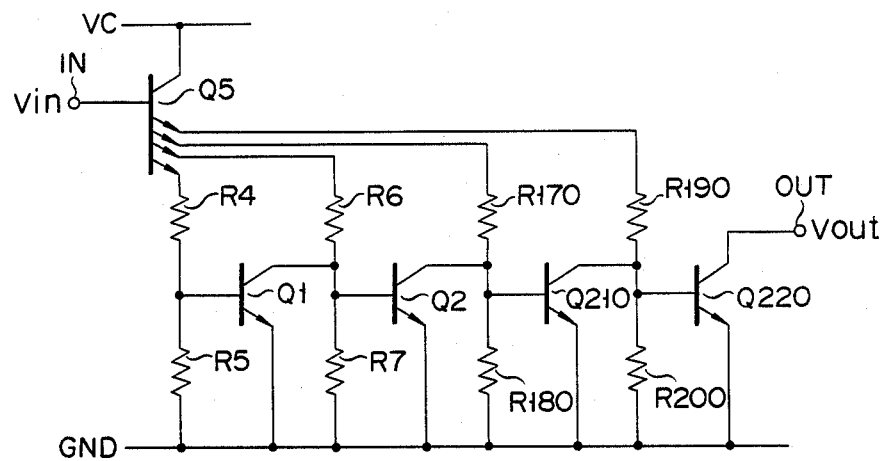

FIG. 17 shows another modification of FIG. 8. The circuit of FIG. 17 may have four inversion potentials when the following is held.

$$R4/R5 > R6/R7 > R170/R180 > R190/R200 \quad (9)$$

FIG. 17 may be used for a quadruple frequency multiplier.

Figure 18:
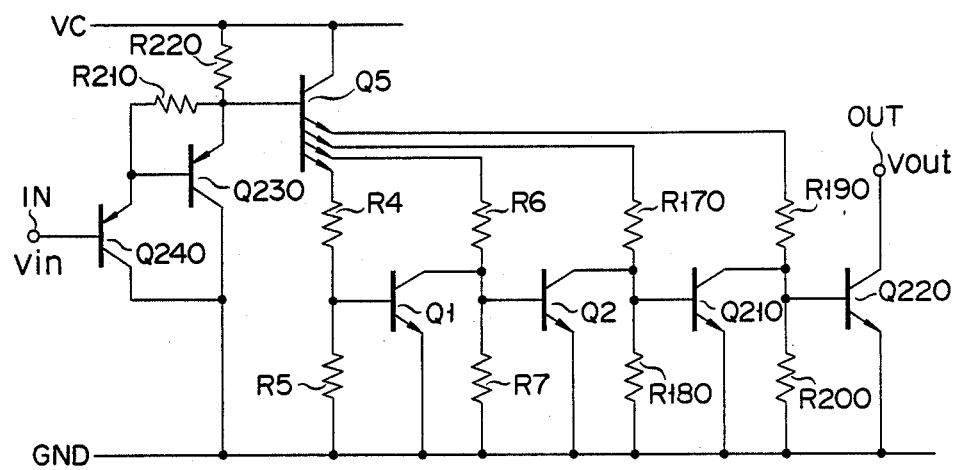

FIG. 18 shows a modification of FIG. 17. In FIG. 18, a two-stage Darlington-connected PNP transistors Q230 and Q240 and resistors R210 and R220 are provided at the input circuit of FIG. 17. Transistors Q230 and Q240 shift the inversion potential VthL by 2 $V_{BE}$ and VthL≈0 volts is possible.

Although specific constructions have been illustrated and described herein, it is not intended that the invention be limited to the elements and constructions disclosed. One skilled in the art will recognize that other particular elements or subconstructions may be used without departing from the scope of the invention. For instance, any of resistors R4 to R7, R170, R180, R190 and R200 may include or may be replaced by any other impedance or voltage drop means.

What is claimed is:

1. A transistor circuit having an output terminal for providing an output signal for resetting an I²L circuit, comprising:
   a first terminal and a second terminal;
   a series circuit of first and second resistors coupled between said first terminal and said second terminal;
   a series circuit of third and fourth resistors coupled between said first and second terminals, the ratio of the resistance value of said first resistor to that of said second resistor being larger than the ratio of the resistance value of said third resistor to that of said fourth resistor;
   a first transistor having a base, collector, and emitter, and whose collector-emitter path is coupled between the junction of said third and fourth resistors and the second terminal, said emitter of said first transistor being directly connected to the second terminal, said second resistor being directly connected to said emitter, and said first transistor being on-off controlled by a potential appearing at the junction of said first and second resistors;
   a second transistor having a base, collector, and emitter, and whose collector-emitter path is coupled between the output terminal and the second terminal, said emitter of said second transistor being directly connected to the second terminal, said fourth resistor being directly connected to said emitter, said said second transistor being on-off controlled by a potential appearing at the junction of said third and fourth resistors; and
   an I²L circuit connected to the output terminal and being reset by operation of the transistor circuit.

2. The transistor circuit of claim 1, wherein said first transistor is a bipolar transistor having a given base-emitter threshold voltage, and said second transistor is a bipolar transistor whose conductivity type is the same as said first transistor and whose base-emitter threshold voltage is substantially the same as the base-emitter threshold voltage of said first transistor.

3. The transistor circuit of claim 1, wherein one of said first and second transistors is a bipolar type and the other of them is an MOS type.

4. The transistor circuit of claim 1, wherein said first terminal is coupled to a power source line of the transistor circuit, and said second terminal is coupled to a circuit ground line.

5. The transistor circuit of claim 1 further comprising a third transistor whose base is coupled to said first terminal, and whose emitter is coupled via said first resistor to the base of said first transistor and via said third resistor to the base of said second transistor.

6. The transistor circuit of claim 5 wherein a first potential applied to said first resistor is smaller than a second potential applied to said third resistor.

7. The transistor circuit of claim 1 further comprising a current source connected to said first terminal, and wherein said I²L circuit is connected between said current source and said second terminal and has a gate connected to the output terminal.

8. A transistor circuit having an output terminal for providing an output signal for resetting an I²L circuit, comprising:
   a first terminal and a second terminal;
   a series circuit of first and second resistors coupled between said first terminal and said second terminal;
   a series circuit of third and fourth resistors coupled between said first and second terminals, the ratio of the resistance value of said first resistor to that of said second resistor being larger than the ratio of the resistance value of said third resistor to that of said fourth resistor;
   a first MOS transistor having a gate, drain and source, and whose drain-source path is coupled between the junction of said third and fourth resistors and the second terminal, said source of said first transistor being directly connected to the second terminal, said second resistor being directly connected to said source, and said first transistor being on-off controlled by a potential appearing at the junction of said first and second resistors;
   a second MOS transistor having a gate, drain and source, and whose conductivity type is the same as said first transistor and drain-source path is coupled between the output terminal and the second terminal, said source of said second transistor being directly connected to the second terminal, said fourth resistor being directly connected to said source, and said second transistor being on-off controlled by a potential appearing at the junction of said third and fourth resistors;

both of said MOS transistors being of the enhancement type and having substantially the same gate-source threshold voltage; and an $I^2L$ circuit connected to the output terminal and being reset by operation of the transistor circuit.

9. A transistor circuit having an output terminal for providing an output signal for resetting an $I^2L$ circuit, comprising:

a first terminal and a second terminal;

an input transistor having a base, collector and emitter and whose base is coupled to said first terminal;

a series circuit of first and second resistors coupled between said emitter and said second terminal;

a series circuit of third and fourth resistors coupled between said emitter and said second terminal, the ratio of the resistance value of said first resistor to that of said second resistor being larger than the ratio of the resistance value of said third resistor to that of said fourth resistor;

a series circuit of fifth and sixth resistors coupled between said emitter and said second terminal;

a first transistor having a base, collector, and emitter, and whose conduction path is coupled between the junction of said third and fourth resistors and the second terminal, said emitter of said first transistor being directly connected to the second terminal, said second resistor being directly connected to said emitter, and said first transistor being on-off controlled by a potential appearing at the junction of said first and second resistors:

a second transistor having a base, collector, and emitter, and whose conduction path is coupled between the junction of said fifth and sixth resistors and the second terminal, said emitter of said second transistor being directly connected to the second terminal, said fourth resistor being directly connected to said emitter, and said second transistor being on-off controlled by a potential appearing at the junction of said third and fourth resistors;

a third transistor whose conduction path is coupled between the output terminal and said second terminal, said third transistor being on-off controlled by a potential appearing at the junction of said fifth and sixth resistors; and an $I^2L$ circuit connected to the output terminal and being reset by operation of the transistor circuit.

10. The transistor circuit of claim 6, further comprising means coupled to said third transistor for shifting said second potential so that the potential difference between said first and second potentials increases.

* * * * *